United States Patent [19]

Sondergeld

[11] Patent Number: 5,952,151

[45] Date of Patent: Sep. 14, 1999

[54] PHOTOPOLYMERIZABLE MIXTURE EXHIBITING LOW OXYGEN SENSITIVITY FOR THE PRODUCTION OF COLOR PROOFS

[75] Inventor: Manfred Sondergeld, Muhlheim/Main, Germany

[73] Assignee: E. I. du Pont de Nemours and Company, Wilmington, Del.

[21] Appl. No.: 08/924,274

[22] Filed: Sep. 5, 1997

[30] Foreign Application Priority Data

Sep. 18, 1996 [DE] Germany .................. 196 38 032

[51] Int. Cl.$^6$ .................................................. G03C 1/492
[52] U.S. Cl. .................. 430/270.1; 430/252; 430/281.1; 430/293; 430/908
[58] Field of Search .................. 430/270.1, 252, 430/293, 908, 285.1, 281.1

[56] References Cited

U.S. PATENT DOCUMENTS

| | | | |
|---|---|---|---|
| 3,060,024 | 10/1962 | Burg et al. ................................. | 96/28 |
| 3,582,327 | 6/1971 | Boyd et al. ................................. | 96/28 |
| 3,620,726 | 11/1971 | Chu et al. ................................. | 96/27 R |
| 3,649,268 | 3/1972 | Chu et al. ................................. | 96/27 R |
| 3,909,282 | 9/1975 | Gray ................................. | 106/288 Q |
| 4,215,193 | 7/1980 | Manger et al. ................................. | 430/291 |
| 4,273,857 | 6/1981 | Leberzammer et al. ................................. | 430/281 |
| 4,734,356 | 3/1988 | Bauer et al. ................................. | 430/293 |
| 4,806,451 | 2/1989 | Fröhlich ................................. | 430/291 |
| 4,849,322 | 7/1989 | Bauer et al. ................................. | 430/285 |
| 4,892,802 | 1/1990 | Bauer et al. ................................. | 430/270 |
| 4,935,331 | 6/1990 | Platzer et al. ................................. | 430/254 |
| 4,948,704 | 8/1990 | Bauer et al. ................................. | 430/291 |
| 5,126,226 | 6/1992 | Fröhlich et al. ................................. | 430/257 |
| 5,210,001 | 5/1993 | Fröhlich et al. ................................. | 430/252 |
| 5,292,622 | 3/1994 | Metzger et al. ................................. | 430/291 |
| 5,372,910 | 12/1994 | Metzger et al. ................................. | 430/202 |
| 5,587,272 | 12/1996 | Grossa et al. ................................. | 430/257 |

FOREIGN PATENT DOCUMENTS 945807  1/1964  United Kingdom .

*Primary Examiner*—Janet Baxter
*Assistant Examiner*—Rosemary Ashton

[57] ABSTRACT

Photopolymerizable mixtures containing a polymeric binder mixture with salt-forming groups, a photopolymerizable monomer, a photoinitiator and at least 10% by weight of a vinyl acetate homopolymer or a vinyl acetate copolymer, and photopolymerizable recording materials made of such mixtures. They exhibit less oxygen sensitivity during the production of color proofs.

4 Claims, No Drawings

PHOTOPOLYMERIZABLE MIXTURE EXHIBITING LOW OXYGEN SENSITIVITY FOR THE PRODUCTION OF COLOR PROOFS

BACKGROUND OF THE INVENTION

1. Field of the Invention

The invention relates to a photopolymerizable mixture for the production of color proofs containing a) a polymeric binder with salt-forming groups or a binder mixture with at least one polymer with salt-forming groups, b) at least one photopolymerizable monomer and c) a photoinitiator or a photoinitiator system; a photopolymerizable recording material; and a process for the production of color proofs.

2. Description of the Related Art

Reproduction technology makes use of screen color separations as the masters in the production of offset or letterpress printing plates. Prior to the exposure of the printing plates, color testing methods are employed to examine the color separations in order to ensure that the prints obtained from the printing plates that have been exposed through said color separations accurately reproduce the master in terms of tone value.

Such color testing methods employ light-sensitive recording materials in which differences in the tackiness of the exposed and unexposed areas of the light-sensitive layer are used to generate the image. Thus, for example, U.S. Pat. Nos. 3,060,024; 3,620,726; 3,582,327; 3,649,268; 4,734,356; 4,849,322; 4,892,802 and 4,948,704 disclose a reproduction method which makes use of a tacky photopolymerizable recording material consisting of a substrate, of a photopolymerizable layer containing at least one addition-polymerizable monomer and a photopolymerization initiator as well as a cover film. This cover film is pulled off, the material is laminated onto an image carrier and hardened by means of imagewise exposure, as a result of which the exposed image areas lose their tackiness. The substrate can be removed either before or after exposure, depending on the material.

The latent image is then made visible by applying appropriate toner materials which only adhere to the unexposed, tacky areas, and can be removed from the non-tacky image areas after application. This method yields positive, optionally color images of the master, whose appearance is similar to images obtained with printing inks.

The toner materials, which consist primarily of fine-particle powders, can be applied by dusting the toner onto the surface that has been exposed imagewise. According to another embodiment, the toner can also be loosely bonded onto a separate carrier and transferred by placing this carrier in contact with the surface that has been exposed imagewise. U.S. Pat. Nos. 4,806,451; 5,126,226; 5,210,001; 5,292,622; 5,372,910 as well as U.S. Pat. No. 4,935,331 describe color testing methods which employ transfer layers specially designed for this purpose.

Even though these prior art methods can fulfill the most important requirements of the printing industry, such as high resolution, good reproduction of the tone value and low dot gain, the known materials, especially those which contain the monomers of the (meth)acrylated bisphenol-A-epoxy-resin type described as the especially preferred material in U.S. Pat. Nos. 4,734,356; 4,849,322; 4,892,802 and 4,948,704, adhere excessively to the carrier film, which leads to holes in the photopolymeric layer, so-called pinholes, on the paper, or else to "reverse adhesion", that is to say, the photopolymeric film peels off the carrier film in differently sized pieces when the cover film is pulled off so that it is not possible to manufacture useable color proofs.

Photopolymerizable layers which do not contain monomers of the (meth)acrylated bisphenol-A-epoxy-resin type do not show these defects. However, the oxygen sensitivity, especially of thin photopolymerizable layers, increases so much that the layer of air trapped between the paper and the photopolymerizable layer prevents photopolymerization to such an extent that the surface of the layer remains tacky and picks up toner even in the exposed areas. This defect is known as "pepper stain".

SUMMARY OF THE INVENTION

Consequently, the present invention had the object of providing photopolymerizable recording materials which do not display excessive adhesion to the cover film nor to the carrier layer or carrier film (may also be referred to as substrate) and which exhibit only slight or no oxygen sensitivity, so that they can be employed to produce flawless color proofs characterized by high resolution, good reproduction of the tone value and low dot gain.

This object is achieved by means of a photopolymerizable mixture for the production of color proofs containing a) a polymeric binder with salt-forming groups or a binder mixture with at least one polymer with salt-forming groups, b) at least one photopolymerizable monomer and c) a photoinitiator or a photoinitiator system, characterized in that it contains at least 10% by weight, relative to the total solids content of the photopolymerizable mixture, of a vinyl acetate homopolymer and/or a vinyl acetate copolymer; by means of a photopolymerizable recording material containing such a photopolymerizable mixture; and by means of a process for the production of color proofs using such a photopolymerizable recording material.

Surprisingly, photopolymerizable mixtures to which vinyl acetate homopolymers or vinyl acetate copolymers have been added do not exhibit excessive adhesion to the cover film or to the substrate, so that the flaws found with state-of-the-art mixtures are not observed here when removing the cover film or the substrate.

Another surprising advantage of the mixtures according to the invention is their low oxygen sensitivity. Even thin photopolymerizable layers, for example, with a thickness of 4 $\mu$m, do not pick up any toner material in the photopolymerized, non-tacky areas. In particular, the reduction in the oxygen sensitivity of acrylate systems could not have been predicted, since polyvinyl acetates are not compatible with acrylate systems and, due to the phase separation into a polymer-rich polyvinyl acetate phase and monomer-rich acrylate phase that takes place, no influence on the oxygen sensitivity of the system could have been expected.

DETAILED DESCRIPTION OF THE INVENTION

Vinyl Polymers

The polymers according to the invention are homopolymers or copolymers of vinyl acetate. Partially saponified polymers can also be employed. Examples of suitable co-monomers are compounds containing carboxyl groups such as, for instance, crotonic acid.

Preference is given to the use of vinyl acetate homopolymers and vinyl acetate-crotonic acid copolymers which normally have a mean molecular weight Mw (weight average) ranging from 30,000 to 1,000,000, preferably from 35,000 to 150,000.

The photopolymerizable mixtures according to the invention contain at least 10% by weight of vinyl acetate homopolymer and/or vinyl acetate copolymer, preferably 18% to 40% by weight, based on the total solids content of the photopolymerizable mixture. But it is also possible to have a higher proportion of the polymers according to the invention.

Binders

Examples of other polymeric binders in the photopolymerizable layers are acrylate and/or methacrylate type thermoplastic binders. Preferably, polymers having a glass transition temperature of less than 70° C. [158° F.] and polymer mixtures with glass transition temperatures of the individual polymers of less than 80° C. [176° F.] are used. In particular, the cross-linkable polymers containing salt-forming groups cited in U.S. Pat. Nos. 4,892,802 and 4,948,704 are suitable as co-binders for the mixtures according to the invention. These are preferably COOH group-containing polyacrylates, polymethacrylates or copolymers of acrylic acid or methacrylic acid with other monomers such as, for example, (meth)acrylic acid esters and/or other (meth) acrylic acid derivatives, vinyl compounds, styrene, butadiene and related monomers. Preference is given to the use of thermoplastic polymers on the basis of acrylate and/or methacrylate, while copolymers of (meth)acrylic acid with methyl acrylate and/or ethyl acrylate or ethyl methacrylate are especially preferred.

The cross-linking of the COOH groups is preferably done by means of polyvalent metal compounds from the groups II A to IV A, II B to IV B and VII B of the periodic table of elements, particularly by means of zinc compounds. The metal compounds can be added to the photopolymerizable layer, for example, in the form of their salts, oxides and alkoxides or else as chelates. These compounds are added in such amounts that at least 10% by weight of the present salt-forming groups of the polymeric binder are cross-linked.

The total amount of polymeric binder is normally 20% to 80% by weight, preferably 30% to 60% by weight, based on the solids content of the photopolymerizable mixture.

Monomers

Another component of the photopolymerizable layer is familiarly known as an ethylenically unsaturated monomer or oligomer. This component is described in U.S. Pat. Nos. 4,892,802 and 4,948,704. Preferably, compounds having several addition-polymerizable, ethylenically unsaturated groups are used. Combinations of these compounds are also a possibility. Especially well-suited are acrylic acid esters and methacrylic acid esters of polyvalent alicyclic and cyclic polyols such as, for instance, ethylene diacrylate, diethylene glycol diacrylate, glycerin-diacrylate and glycerin-triacrylate, 1,3-propane diol dimethacrylate, 1,2,4-butane triol trimethacrylate, pentaerythritol tetramethacrylate, trimethylol propane trimethacrylate, polyoxy-ethylated trimethylol propane acrylate or polyoxy-ethylated trimethylol propane methacrylate, hexamethylene diol diacrylate. The monomers are commonly employed in amounts ranging from 10% to 80 by weight, based on the total solids content, preferably from 20% to 60% by weight.

Photoinitiators

As photoinitiators, it is possible to use practically all compounds known for this purpose, which are also cited in U.S. Pat. Nos. 4,892,802 and 4,948,704, in amounts ranging from 0.01% to 15% by weight, based on the total solids content. Examples of these are benzil, benzil dimethyl ketal, benzoin, benzoin isopropyl ether, (-methyl benzoin, 1,4-naphthoquinone, Michler's ketone and benzophenone, as well as systems made up of substituted thioxanthones and tertiary amines.

Additives

Other additives, such as plasticizers, may be present in the photopolymerizable layer. They are present in the amount of 5% to 30% by weight. Some suitable plasticizers include alkyl phosphates, polyethylene glycols, polyhydroxy ethylene glycol ether, diesters of phthalic acid, adipic acid and caproic acid. Preference is given to the use of liquid acrylate polymers or methacrylate polymers or to butadiene/acrylonitrile copolymers with salt-forming groups.

Aside from the components already mentioned, the photopolymerizable layers can also contain other additives such as, for example, sensitizing agents, fillers, thermal stabilizers, antioxidants, casting auxiliaries, etc.

The photopolymerizable mixtures can be applied according to known methods from common solvents, preferably from organic solvents such as, for instance, methylene chloride, toluene-methanol mixtures or other mixtures of aromatic solvents and alcohols, esters or ketones, onto suitable substrates, after which they are dried.

Examples of suitable substrates are plastic films made of polyethylene, polypropylene, polyamides or polyesters. Special preference is given to polyethylene terephthalate films, particularly those having a thickness of at least 12 μm. If non-transparent substrates are employed, they are removed prior to the imagewise exposure.

Flexible plastic films such as, for example, polyethylene films and polypropylene films, particularly polypropylene films having a thickness ranging from 10 to 24 μm are employed as the cover film.

The layer thickness of the photopolymerizable recording layer preferably lies between 3 μm and 10 μm.

The photopolymerizable materials display their greatest sensitivity in the ultraviolet range, preferably in the wave length range between 250 and 450 nm. Therefore, the photopolymerizable layers are exposed imagewise by means of a suitable source of radiation such as, for instance, xenon lamps, mercury-vapor lamps and lasers.

Suitable image carrier materials are substrates such as paper, cardboard, metals, films or plates made of polymers such as, for instance, polyethylene, polyvinyl chloride or polyamide, which can be provided with additional auxiliary layers.

Toning of the imagewise exposed recording layer can take place either by means of dusting with toner materials consisting primarily of fine-particle powders, such as those known, for example, from U.S. Pat. Nos. 4,215,193 and 3,909,282, or else by means of pigmented toning films which contain the toner material loosely bonded to a separate carrier. Such toning films are described, for example, in U.S. Pat. Nos. 5,292,622; 5,372,910; 4,806,451; and 4,935,331. The material and process according to the invention can be advantageously employed for the reproduction of line images or screen images for applications in the graphic and other industrial sectors as well as for the manufacture of printed circuit boards. The main area of application is the production of monochromatic or polychromatic images, particularly for use for color proofs.

The production of a color proof according to the present invention comprises the following process steps:

The photopolymerizable recording material, for instance, a laminate consisting of a photopolymerizable layer applied onto a substrate and of a cover film is placed onto an image-receiving material after the cover film has been removed and then exposed to actinic radiation through the transparent substrate using a screen color separation positive of a first color as the master, for purposes of forming tacky and non-tacky areas.

After removal of the substrate, the layer with the imagewise tacky and non-tacky areas is toned in the tacky areas. For this purpose, a pigmented transfer layer is normally applied and its carrier film or carrier layer is pulled off again with the non-transferred areas, or else a powder toner is applied onto the tacky areas of the imagewise photopolymerized layer. The result is a color image of the master.

In order to produce a polychromatic proof, a second laminate of the photopolymerizable recording material is laminated onto the image after removal of the cover film and then exposed under the same conditions through a screen color separation positive of a second color as the master, after which it is toned.

This procedure is subsequently repeated for a color separation of a third color and, if desired, for a black color separation. The result is a color image that matches the master.

The examples below will serve to illustrate the invention. Unless otherwise indicated, the parts and percentages indicated refer to the weight. The mean molecular weights of the polymers are given as weight average molecular weight, Mw.

EXAMPLES

Example 1 (Comparative Example)

A recording material was prepared as described in Example 7 of U.S. Pat. Nos. 4,892,802 and 4,948,704.

The 15% coating solution in a mixture consisting of toluene and methanol (50/50 vol %) contained the following:

| Ingredients | Amount (g) |
| --- | --- |
| Ethyl acrylate/methyl methacrylate/acrylic acid copolymer (17/71/12), Mw = 200,000 | 25.00 |
| Ethyl acrylate/methyl methacrylate/acrylic acid copolymer (57/39/4), Mw = 192,000 | 17.94 |
| Ethyl acrylate/acrylic acid copolymer (92/8), Mw = 7000, Tg = -14° C. [6.8° F.] | 5.58 |
| Diacrylate ester of a bisphenol-A-epoxy resin, obtained from bisphenol-A and epichlorohydrin (viscosity at 25° C. [77° F.] = 1,000,000 cps) | 18.50 |
| Trimethylol propane trimethacrylate | 13.58 |
| Trimethylol propane | 5.05 |
| Glycerin triacetate | 6.71 |
| 7-(4'-chloro-6'-diethyl amino-1',3',5'-triazine-4'-yl)-amino-3-phenyl coumarin | 2.05 |
| 2-Mercaptobenzoxazole | 0.82 |
| 2,2'-Bis-(o-chlorophenyl)-4,4',5,5'-tetraphenyl biimidazole | 1.70 |
| 1,4,4-Trimethyl-2,3-diazobicyclo-(3,2,2,)-non-2-ene-2,3-dioxide | 0.05 |
| Diethyl hydroxylamine | 0.11 |
| Methoxy hydroquinone | 0.02 |
| Polycaprolactone, Mw = 30,000 | 0.60 |
| Zinc acetyl acetonate | 2.29 |

This coating solution was then applied onto a polyethylene terephthalate film (12.5 μm) in such a way that, after drying at 55° C. [131° F.], it yielded a 4 μm-thick radiation-sensitive layer. Subsequently, a 19 μm-thick cover film made of polypropylene was laminated onto it. This material was wound up to form a roll. The roll was clamped in a commercial Cromalin® Whiteline-Laminator manufactured by E. I. du Pont de Nemours and Company, Wilmington, Del. (hereinafter DuPont), with the laminator roll temperature at 95° C. [203° F.]. After a retention time of one hour in the laminator, the radiation-sensitive layer with the polyethylene terephthalate carrier film was laminated onto a commercial Cromalin® CP-2 paper manufactured by DuPont. In this process, it was noticed that large sections of the surface of the radiation-sensitive layer were stuck to the cover film when the polypropylene cover film in the laminator was pulled off and these sections were not laminated onto the paper as desired. Due to this defective transfer of the radiation-sensitive layer onto the paper, it was not possible to produce a useable color proof.

Example 2 (Comparative Example)

As described in Example 1, a recording material was produced in the form of rolls from the following coating solution in a mixture consisting of toluene and methanol (25/75 vol-%):

| Ingredients | Amount (g) |
| --- | --- |
| Ethyl acrylate/methyl methacrylate/acrylic acid copolymer (17/71/12), Mw = 200,000 | 20.00 |
| Ethyl acrylate/methyl methacrylate/acrylic acid copolymer (57/39/4), Mw = 192,000 | 26.25 |
| Ethyl acrylate/acrylic acid copolymer (92/8), Mw = 7000, Tg = -14° C. [6.8° F.] | 11.13 |
| Trimethylol propane trimethacrylate | 35.58 |
| 7-(4'-chloro-6'-diethyl amino-1',3',5'-triazine-4'-yl)-amino-3-phenyl coumarin | 2.05 |
| 2-Mercaptobenzoxazole | 0.82 |
| 2,2'-Bis-(o-chlorophenyl)-4,4',5,5'-tetraphenyl biimidazole | 1.70 |
| 1,4,4-Trimethyl-2,3-diazobicyclo-(3,2,2,)-non-2-ene-2,3-dioxide | 0.05 |
| Diethyl hydroxylamine | 0.11 |
| Methoxy hydroquinone | 0.02 |
| Zinc acetyl acetonate | 2.29 |

The roll was clamped in a commercial Cromalin® Whiteline-Laminator manufactured by DuPont, with the laminator roller temperature was 95° C. [203° F.]. After a retention time of two hours in the laminator, the radiation-sensitive layer with the polyethylene terephthalate carrier film was laminated onto a commercial Cromalin® CP-2 paper manufactured by DuPont. The radiation-sensitive layer was completely transferred onto the paper. Using a screen cyan color separation positive, the radiation-sensitive layer was exposed through the carrier film in a commercial 1000-watt Cromalin® Whiteline exposure device manufactured by DuPont. After the carrier film was pulled off, cyan toner was applied using a Cromalin® ATM III automated toner machine manufactured by DuPont. The toner was picked up well by the unexposed, tacky areas, and a cyan color separation was obtained that matched the master and that had a resolution of 2% to 98% dots at a screen width of 60 lines per cm. In the exposed areas, which were not supposed to pick up any toner, "pepper stain" could be clearly seen. No useable color proof could be made.

Example 3

As described in Example 1, a recording material was produced in the form of rolls from the following coating solution in a mixture consisting of toluene and methanol (25/75 vol-%):

| Ingredients | Amount (g) |
| --- | --- |
| Ethyl acrylate/methyl methacrylate/acrylic acid copolymer (17/71/12), Mw = 200,000 | 19.50 |
| Ethyl acrylate/methyl methacrylate/acrylic acid copolymer (57/39/4), Mw = 192,000 | 14.07 |

-continued

| Ingredients | Amount (g) |
| --- | --- |
| Ethyl acrylate/acrylic acid copolymer (92/8), Mw = 7000, Tg = −14° C. [6.8° F.] | 2.00 |
| Vinyl acetate and crotonic acid copolymer, Mw = 100,000, acid number = 35 to 45 mg of KOH per gram of polymer | 20.00 |
| Trimethylol propane trimethacrylate | 31.58 |
| polyoxyethylene (4) lauryl ether | 6.00 |
| 7-(4'-chloro-6'-diethyl amino-1',3',5'-triazine-4'-yl)-amino-3-phenyl coumarin | 2.05 |
| 2-Mercaptobenzoxazole | 0.82 |
| 2,2'-Bis-(o-chlorophenyl)-4,4',5,5'-tetraphenyl biimidazole | 1.70 |
| 1,4,4-Trimethyl-2,3-diazobicyclo-(3,2,2,)-non-2-ene-2,3-dioxide | 0.05 |
| Diethyl hydroxylamine | 0.11 |
| Methoxy hydroquinone | 0.02 |
| Zinc acetyl acetonate | 2.10 |

The material produced in this manner was treated as described in Example 2. The radiation-sensitive layer was completely transferred onto the paper and a cyan color separation was obtained with a resolution of 2% to 98% dots at a screen width of 60 lines per cm. The exposed areas had not picked up any toner whatsoever and were thus completely free of "pepper stain". Moreover, the material according to the invention did not exhibit any holes in the photopolymeric layer, "pinholes", due to pieces of the photopolymeric layer being torn out when the carrier film was pulled off.

Example 4

As described in Example 1, a recording material was produced in the form of rolls from the following coating solution in a mixture consisting of toluene and methanol (25/75 vol-%):

| Ingredients | Amount (g) |
| --- | --- |
| Ethyl acrylate/methyl methacrylate/acrylic acid copolymer (17/71/12), Mw = 200,000 | 18.00 |
| Ethyl acrylate/acrylic acid copolymer (92/8), Mw = 7000, Tg = −14° C. [6.8° F.] | 2.00 |
| Vinyl acetate and crotonic acid copolymer, Mw = 100,000, acid number = 35 to 45 mg of KOH per gram of polymer | 35.67 |
| Ethoxylated trimethylol propane triacrylate, 3 moles of ethylene oxide | 16.00 |
| Trimethylol propane trimethacrylate | 16.83 |
| polyoxyethylene (4) lauryl ether | 5.75 |
| 7-(4'-chloro-6'-diethyl amino-1',3',5'-triazine-4'-yl)-amino-3-phenyl coumarin | 2.05 |
| 2-Mercaptobenzoxazole | 0.82 |
| 2,2'-Bis-(o-chlorophenyl)-4,4',5,5'-tetraphenyl biimidazole | 1.70 |
| 1,4,4-Trimethyl-2,3-diazobicyclo-(3,2,2,)-non-2-ene-2,3-dioxide | 0.05 |
| Diethyl hydroxylamine | 0.11 |
| Methoxy hydroquinone | 0.02 |
| Zinc acetyl acetonate | 1.00 |

The material produced in this manner was treated as described in Example 2. The toner material, however, was applied by laminating and pulling off a commercial Euro-Sprint® cyan-transfer film manufactured by DuPont. In this process, the radiation-sensitive layer was completely transferred onto the paper and a cyan color separation was obtained that had a resolution of 2% to 98% dots at a screen width of 60 lines per cm. The exposed areas had not picked up any toner whatsoever and were thus completely free of "pepper stain". Moreover, the material according to the invention did not exhibit any holes in the photopolymeric layer, "pinholes", due to pieces of the photopolymeric layer being torn out when the carrier film was pulled off.

Example 5

As described in Example 1, a recording material was produced in the form of rolls from the following casting solution in a mixture consisting of toluene and methanol (25/75 vol-%):

| Ingredients | Amount (g) |
| --- | --- |
| Ethyl acrylate/methyl methacrylate/acrylic acid copolymer (17/71/12), Mw = 200,000 | 21.00 |
| Ethyl acrylate/acrylic acid copolymer (92/8), Mw = 7000, Tg = −14° C. [6.8° F.] | 2.00 |
| Polyvinyl acetate homopolymer, Mw = 110,000, acid number = 1 to 2 mg of KOH per gram of polymer | 33.67 |
| Ethoxylated trimethylol propane triacrylate, 3 moles of ethylene oxide | 37.58 |
| 7-(4'-chloro-6'-diethyl amino-1',3',5'-triazine-4'-yl)-amino-3-phenyl coumarin | 2.05 |
| 2-Mercaptobenzoxazole | 0.82 |
| 2,2'-Bis-(o-chlorophenyl)-4,4',5,5'-tetraphenyl biimidazole | 1.70 |
| 1,4,4-Trimethyl-2,3-diazobicyclo-(3,2,2,)-non-2-ene-2,3-dioxide | 0.05 |
| Diethyl hydroxylamine | 0.11 |
| Methoxy hydroquinone | 0.02 |
| Zinc acetyl acetonate | 1.00 |

The material produced in this manner was treated as described in Example 2. The toner material was applied using toner powder as well as a transfer film. In this process, the radiation-sensitive layer was completely transferred onto the paper and a cyan color separation was obtained that had a resolution of 2% to 98% dots at a screen width of 60 lines per cm. The exposed areas had not picked up any toner whatsoever and were thus completely free of "pepper stain". Moreover, the material according to the invention did not exhibit any holes in the photopolymeric layer, "pinholes", due to pieces of the photopolymeric layer being torn out when the carrier film was pulled off.

Example 6

In order to produce a four-color proof, four recording materials according to Example 3 and commercial Euro-Sprint® transfer films for the colors cyan, magenta, yellow and black were used. After removal of the cover film, a first recording material is laminated onto an image-receiving material and exposed through a screen positive cyan color separation in a vacuum printing frame with a metal-halide lamp (3000 watts) using an ultraviolet-permeable filter 42 s at a distance of 95 cm. After removal of the substrate, the cyan transfer layer is laminated onto the imagewise exposed layer and then pulled off again immediately. The transfer layer only remains adhering to the unexposed, tacky areas and the result is a positive cyan image of the master.

A second layer of the positively tonable photopolymerizable recording material is laminated onto the cyan image in the manner described above through the corresponding screen magenta color separation. After removal of the substrate, the magenta transfer layer is laminated onto the imagewise exposed layer and then pulled off again. The transfer layer only remains adhering to the unexposed, tacky areas and the result is a positive magenta image. The same work steps are repeated for the yellow and black colors and subsequently a protective layer is applied in the usual manner. The result is a four-color proof with excellent brilliance and sharpness, with a resolution of 1% to 99% in the 60-line-per-cm screen, which constitutes a faithful reproduction of the original. Both the cover films and the carrier layers of the recording materials can be pulled off easily and without any flaws, and the radiation-sensitive layers were completely transferred. The adhesion of the recording layers to each other and to the image-receiving material was excellent. Neither "pepper stains" nor "pinholes" were observed.

What is claimed is:

1. A process for the production of color proofs comprising
   i) providing a photopolymerizable recording material comprising a substrate, photopolymerizable layer and a cover film, wherein the photopolymerizable layer consists of a photopolymerizable mixture containing:
      a) a polymeric binder with salt-forming groups or a binder mixture with at least one polymer with salt-forming groups;
      b) at least one photopolymerizable monomer;
      c) a photoinitiator or a photoinitiator system; and
      d) at least one vinyl polymer selected from a vinyl acetate homopolymer, a vinyl acetate copolymer and mixtures thereof, wherein the vinyl polymer is present in the amount of at least 10% by weight, based on the total solids content of the photopolymerizable mixture;
   ii) pulling off the cover film of the photopolymerizable recording material;
   iii) laminating the photopolymerizable recording material onto an image carrier material, with the photopolymerizable layer adjacent the image carrier material;
   iv) exposing the photopolymerizable layer imagewise in order to generate tacky and non-tacky areas;
   v) pulling off the substrate before or after imagewise exposure of the photopolymerizable layer; and
   vi) applying toner onto the tacky areas of the imagewise exposed layer to form a toned image;

wherein the at least one vinyl polymer reduces excessive adhesion of the photopolymerizable layer to the cover film or to the substrate.

2. The process according to claim 1, wherein steps (i) through vi) are repeated several times, and wherein under (i), a new photopolymerizable recording material is employed and under ii), this material is applied onto the toned image containing layer from step (vi).

3. The process according to claim 1, wherein the vinyl polymer is selected from copolymers of vinyl acetate and crotonic acid.

4. The process according to claim 1, wherein the vinyl polymer also reduces oxygen sensitivity of the photopolymerizable layer.

* * * * *